(12) United States Patent
Huang et al.

(10) Patent No.: US 10,600,915 B2
(45) Date of Patent: Mar. 24, 2020

(54) FLEXIBLE SUBSTRATE STRUCTURE, FLEXIBLE TRANSISTOR AND METHOD FOR FABRICATING THE SAME

(71) Applicant: National Applied Research Laboratories, Taipei (TW)

(72) Inventors: Wen-Hsien Huang, Hsinchu (TW); Jia-Min Shieh, Hsinchu (TW); Chang-Hong Shen, Hsinchu (TW)

(73) Assignee: National Applied Research Laboratories, Taipei (TW)

( * ) Notice: Subject to any disclaimer, the term of this patent is extended or adjusted under 35 U.S.C. 154(b) by 0 days.

(21) Appl. No.: 15/905,729

(22) Filed: Feb. 26, 2018

(65) Prior Publication Data

US 2018/0248044 A1    Aug. 30, 2018

Related U.S. Application Data

(60) Provisional application No. 62/465,085, filed on Feb. 28, 2017.

(51) Int. Cl.
*H01L 29/786* (2006.01)
*H01L 21/324* (2006.01)
(Continued)

(52) U.S. Cl.
CPC .. *H01L 29/78603* (2013.01); *H01L 21/02488* (2013.01); *H01L 21/02505* (2013.01); *H01L 21/02532* (2013.01); *H01L 21/02675* (2013.01); *H01L 21/02686* (2013.01); *H01L 21/324* (2013.01); *H01L 23/49855* (2013.01);
(Continued)

(58) Field of Classification Search
CPC ........... H01L 31/03626; H01L 23/5387; H01L 23/49855
See application file for complete search history.

(56) References Cited

U.S. PATENT DOCUMENTS 6,107,117 A * 8/2000 Bao ...................... H01L 51/0036
438/151
10,361,258 B2 * 7/2019 Yamazaki ........... H01L 27/3246
(Continued)

FOREIGN PATENT DOCUMENTS

TW    M377823 U1    4/2010
TW    M432222 U1    6/2012
(Continued)

OTHER PUBLICATIONS

Li et al. "Fabrication of air-stable n-type carbon nanotube thin-film transistors on flexible substrates using bilayer dielectrics" 2015, Nanoscale, 2015, 7, 17693-17701 (Year: 2015).*

*Primary Examiner* — Ngan V Ngo

(57) ABSTRACT

A flexible substrate structure including a flexible substrate, a first dielectric layer, a metal-containing layer and a second dielectric layer is provided. The first dielectric layer is located on the flexible substrate. The metal-containing layer has a reflectivity greater than 15% and a heat transfer coefficient greater than 2 W/m-K. The metal-containing layer is disposed between the first dielectric layer and the second dielectric layer, and the second dielectric layer is an inorganic material layer. A flexible transistor including the above-mentioned flexible substrate structure and a method for fabricating the same are also provided.

7 Claims, 4 Drawing Sheets

(51) Int. Cl.
  *H01L 21/02* (2006.01)
  *H01L 29/66* (2006.01)
  *H01L 23/538* (2006.01)
  *H01L 23/498* (2006.01)
  *H01L 29/423* (2006.01)
  *H01L 27/12* (2006.01)

(52) U.S. Cl.
  CPC .... *H01L 23/5387* (2013.01); *H01L 29/66757* (2013.01); *H01L 29/78675* (2013.01); *H01L 27/1218* (2013.01); *H01L 29/42384* (2013.01)

(56) References Cited

U.S. PATENT DOCUMENTS

| | | | | |
|---|---|---|---|---|
| 2003/0049560 | A1* | 3/2003 | Nirmal | B41M 3/006 430/200 |
| 2011/0039097 | A1* | 2/2011 | Murashige | B32B 17/064 428/337 |
| 2011/0068332 | A1* | 3/2011 | Han | H01L 29/4908 257/40 |
| 2012/0161132 | A1* | 6/2012 | Yamazaki | H01L 27/1225 257/57 |
| 2012/0256181 | A1* | 10/2012 | Shieh | H01L 27/142 257/57 |
| 2013/0099264 | A1* | 4/2013 | Zimmerman | H01L 33/64 257/89 |
| 2015/0280010 | A1* | 10/2015 | Shieh | H01L 29/04 257/66 |
| 2016/0163868 | A1* | 6/2016 | Kobayashi | H01L 29/7869 257/43 |
| 2018/0090720 | A1* | 3/2018 | Hack | H01L 51/5281 |
| 2018/0212006 | A1* | 7/2018 | Yamazaki | H01L 27/3246 |
| 2018/0337196 | A1* | 11/2018 | Yang | H01L 27/1266 |

FOREIGN PATENT DOCUMENTS

| | | |
|---|---|---|
| TW | 201532841 A | 9/2015 |
| TW | 201632960 A | 9/2016 |
| TW | 201721845 A | 6/2017 |
| TW | 201801305 A | 1/2018 |

\* cited by examiner

FLEXIBLE SUBSTRATE STRUCTURE, FLEXIBLE TRANSISTOR AND METHOD FOR FABRICATING THE SAME

FIELD OF THE INVENTION

The present invention relates to a flexible substrate structure, and more particularly to a flexible substrate structure that can be applied to laser processing. The present invention also relates to a flexible transistor including the flexible substrate structure and a method for fabricating the flexible transistor.

BACKGROUND OF THE INVENTION

With the advancement and rapid development of science and technology, electronic products such as liquid crystal displays, mobile phones, notebook computers and digital cameras have become very popular. They are not only frequently used by the general public but are also the focus and trend of industrial production. In the market, the pursuit of high performance, high convenience, portability and the trend of miniaturization, the existing transistor fabricating process has been unable to meet demand. Therefore, in recent years, many researchers have devoted themselves to the development of flexible transistors in order to expand the application range and variability of the transistors.

Generally, flexible substrates used for fabricating flexible transistors mainly contain organic flexible substrates made of organic materials, which are not resistant to high temperatures. Therefore, in the process of fabricating a flexible transistor, in order to prevent the organic flexible substrate from being cracked by heat, a short wavelength laser with low transmittance is mostly used to crystallize amorphous or nanocrystalline-phase semiconductor material on an organic flexible substrate to form a polycrystalline material layer, and the source/drain activation is performed by using a low-temperature and long-time thermal annealing process. However, the limits of the above process make it difficult to further reduce the size of the flexible transistor, thereby hindering the trend toward the miniaturization of electronic products.

SUMMARY OF THE INVENTION

One objective of the present invention is to provide a flexible substrate structure, which includes a flexible substrate, a first dielectric layer, a metal-containing layer and a second dielectric layer. The first dielectric layer is located on the flexible substrate. The metal-containing layer has a reflectivity greater than 15% and a heat transfer coefficient greater than 2 W/m-K. The metal-containing layer is disposed between the first dielectric layer and the second dielectric layer, and the second dielectric layer is an inorganic material layer.

In a preferred embodiment of the present invention, the first dielectric layer is an inorganic material layer.

In a preferred embodiment of the present invention, the metal-containing layer contacts and is disposed on the first dielectric layer, and the second dielectric layer contacts and is disposed on the metal-containing layer.

In a preferred embodiment of the present invention, a glass transition temperature of the flexible substrate is lower than 450° C.

In a preferred embodiment of the present invention, the metal-containing layer completely covers the first dielectric layer.

In a preferred embodiment of the present invention, the metal-containing layer completely covers the flexible substrate.

Another objective of the present invention is to provide a flexible transistor, which includes a flexible substrate structure and a transistor element. The flexible substrate structure includes a flexible substrate, a first dielectric layer, a metal-containing layer and a second dielectric layer. The first dielectric layer is located on the flexible substrate. The metal-containing layer has a reflectivity greater than 15% and a heat transfer coefficient greater than 2 W/m-K. The metal-containing layer is disposed between the first dielectric layer and the second dielectric layer, and the second dielectric layer is an inorganic material layer. The transistor element is formed on the second dielectric layer and has a channel width and a gate length. The channel width is less than 1 um. The gate length is less than 1 um. The transistor element includes a source/drain structure and a gate structure. The source/drain structure is formed on the second dielectric layer and has a polycrystalline structure. The gate structure is disposed on the source/drain structure.

In a preferred embodiment of the present invention, the first dielectric layer is an inorganic material layer.

Another objective of the present invention is to provide a method for fabricating a flexible transistor, which includes: providing a supporting substrate and a flexible substrate disposed on the supporting substrate; sequentially forming a first dielectric layer, a metal-containing layer, a second dielectric layer and an amorphous or nanocrystalline-phase semiconductor layer on the flexible substrate, wherein the metal-containing layer has a reflectivity greater than 15% and a heat transfer coefficient greater than 2 W/m-K; performing a laser annealing on the amorphous or nanocrystalline-phase semiconductor layer to form a polycrystalline semiconductor layer; removing a portion of the polycrystalline semiconductor layer to form a channel pattern layer; forming a gate structure on the channel pattern layer; and removing the supporting substrate.

In a preferred embodiment of the present invention, the step of performing a laser annealing on the amorphous or nanocrystalline-phase semiconductor layer comprises: irradiating a multi-band laser beam onto the amorphous or nanocrystalline-phase semiconductor layer.

In a preferred embodiment of the present invention, a wavelength of the multi-band laser beam is between 193 nm and 10.6 um.

In a preferred embodiment of the present invention, the method for fabricating a flexible transistor further comprises: performing laser activation on the channel pattern layer to form a source/drain structure.

In a preferred embodiment of the present invention, the step of performing laser activation on the channel pattern layer comprises: irradiating a multi-band laser beam onto a portion of the channel pattern layer to form the source/drain structure.

In summary, the present invention provides a flexible substrate structure, a flexible transistor including the above-mentioned flexible substrate structure and a method for fabricating the same. The flexible substrate structure can be applied to a long wavelength (for example, a wavelength longer than 193 nm) laser processing, such as laser annealing or laser activation. Crystallization (e.g., laser crystallization) and activation (e.g., laser activation) in a flexible transistor process can be performed based on the existing materials and laser technology conventionally used on the production line, so that a small-sized flexible transistor element that cannot be achieved by the thermal annealing process can be fabricated, the size of the flexible transistor element makes can be further reduced to less than 1 um and even to 400 nm or less.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
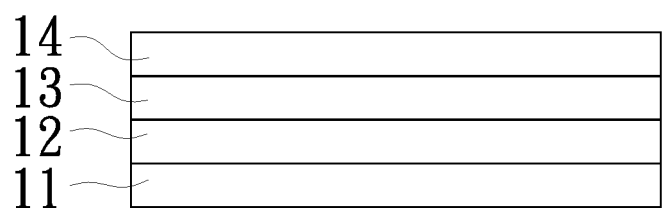
FIG. 1 is a schematic structural view of a flexible substrate drawn according to a preferred embodiment of the present invention.

FIG. 1 is a schematic structural view of a flexible substrate structure 10 according to an embodiment of the present invention. Referring to FIG. 1, the flexible substrate structure 10 can be used for fabricating a flexible transistor and includes a flexible substrate 11, a first dielectric layer 12, a metal-containing layer 13 and a second dielectric layer 14. The flexible substrate 11 is an organic polymer and may be selected from the group consisting of polyethylene terephthalate (PET), polyethylene naphthalate (PEN), polyethersulfone (PES) and polyimide (PI), or any combination of these organic polymers. In addition, the glass transition temperature of the flexible substrate 11 may be lower than 450° C., such as 410° C. or 400° C., so that the flexible substrate 11 will not be easily deteriorated or damaged by high temperature.

The second dielectric layer 14 is an inorganic material layer, such as silicon oxide (e.g., silicon dioxide), silicon nitride or silicon oxynitride, or any combination of these materials. The first dielectric layer 12 and the second dielectric layer 14 may be the different materials, for example, the second dielectric layer 14 may be an organic material layer. Alternatively, the first dielectric layer 12 and the second dielectric layer 14 may be the same material, for example, the first dielectric layer 12 is also an inorganic material layer. At least one of the first dielectric layer 12 and the second dielectric layer 14 may be a multilayer film, and the two may be the same or different multilayer films. The material of one of the multilayer films may be oxidized silicon (such as silicon dioxide), silicon nitride or silicon oxynitride, and the multilayer film can be made of film layers with at least two different materials or made of film layers with the same material.

The thickness of the first dielectric layer 12 may be between 50 and 1000 nanometers, and the thickness of the second dielectric layer 14 may be between 50 and 1000 nanometers, therefore, the thickness of the second dielectric layer 14 may be greater than the thickness of the first dielectric layer 12. The sum of the thicknesses of the first dielectric layer 12 and the second dielectric layer 14 may be between 1.5 and 2.5 micrometers, preferably less than or equal to 2 micrometers, while the ratio of the thickness of the first dielectric layer 12 to the thickness of the second dielectric layer 14 is preferably between 0.1 and 4, so as to avoid the stress problem caused by the difference in thickness between the first dielectric layer 12 and the second dielectric layer 14.

The thickness of the metal-containing layer 13 may be between 50 and 500 nanometers, for example, between 50 and 300 nanometers. The metal-containing layer 13 contacts and is disposed on the first dielectric layer 12, and the second dielectric layer 14 contacts and is disposed on the metal-containing layer 13, as shown in FIG. 1. The metal-containing layer 13 can be made of pure metal or other materials containing metal atoms. Pure metals are such as silver (Ag), gold (Au), aluminum (Al), tungsten (W), titanium (Ti), tantalum (Ta) or molybdenum (Mo), and the materials containing metal atoms may be metal compound, alloy, synthetic ceramic material or composite metal material, such as AlCu, Al—Si—Cu, TiN or TaN. In addition, the metal-containing layer 13 can also be replaced by a layer of a thermally conductive carbon related materials, such as graphene.

The reflectivity of the metal-containing layer 13 is greater than 15%, for example 20%, greater than 20% or 50%. The heat transfer coefficient (for indicating the thermal conductivity) of the metal-containing layer 13 is greater than 2 W/m-K, and the thermal diffusivity of the metal-containing layer 13 is greater than $9 \times 10^{-7}$ m$^2$/s. For example, the metal-containing layer 13 is a film made of silver, gold or aluminum silicon copper alloy, and its reflectivity may be greater than 50% and its heat transfer coefficient may be greater than 20 W/m-K. For example, the metal-containing layer 13 is a film made of titanium nitride, and its reflectivity may be greater than 15% and its heat transfer coefficient may be greater than 2 W/m-K.

Since the metal-containing layer 12 has a reflectivity greater than 15%, the metal-containing layer 12 can block light (such as a laser beam) and also reflect light of certain intensity. The metal-containing layer 13 completely covers the first dielectric layer 12 and completely shields the flexible substrate 11. Thus, when a light (such as a laser beam) is incident on the flexible substrate structure 10 from the second dielectric layer 14, the metal-containing layer 13 can shield the light so that the light does not enter the flexible substrate 11 under the metal-containing layer 13.

Figure 2A:
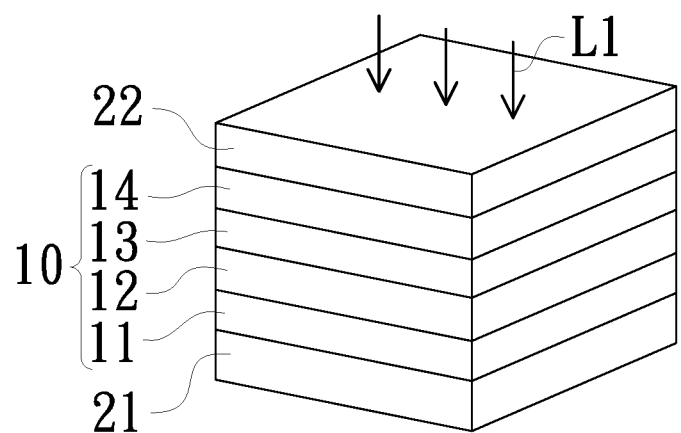
FIGS. 2a-2f are schematic views of structures of flexible transistors fabricated in different process steps according to an embodiment of the present invention.

FIGS. 2a-2f are schematic views of structures of flexible transistors fabricated in different process steps according to an embodiment of the present invention. For ease of understanding, the same reference numbers are used in FIGS. 2a-2f for elements having the same functions in FIG. 1, but the present invention is not limited thereto. Referring to FIG. 2a, in the method for fabricating a flexible transistor, firstly, a supporting substrate 21 and a flexible substrate 11 disposed on the supporting substrate 21 are provided. The supporting substrate 21 may be a rigid board, for example, a wafer, a glass plate, a ceramic plate or a metal plate. The flexible substrate 11 can be adhered to the supporting substrate 21, but the flexible substrate 11 is temporarily fixed on the supporting substrate 21. For example, a de-bonding layer (DBL) may be sandwiched between the support substrate 21 and the flexible substrate 11 to enable the flexible substrate 11 and the support substrate 21 to be separated from each other in a subsequent process. The de-bonding layer may be a release layer so that the flexible substrate 11 can be peeled from the supporting substrate 21.

Thereafter, the first dielectric layer 12, the metal-containing layer 13 and the second dielectric layer 14 are sequentially formed on the flexible substrate 11. The first dielectric layer 12 and the second dielectric layer 14 may be formed by chemical vapor deposition (CVD). The metal-containing layer 13 may be formed by chemical vapor deposition or physical vapor deposition (PVD). Thereafter, a subsequent process is performed to form a transistor element on the second dielectric layer 14.

Figure 2B:
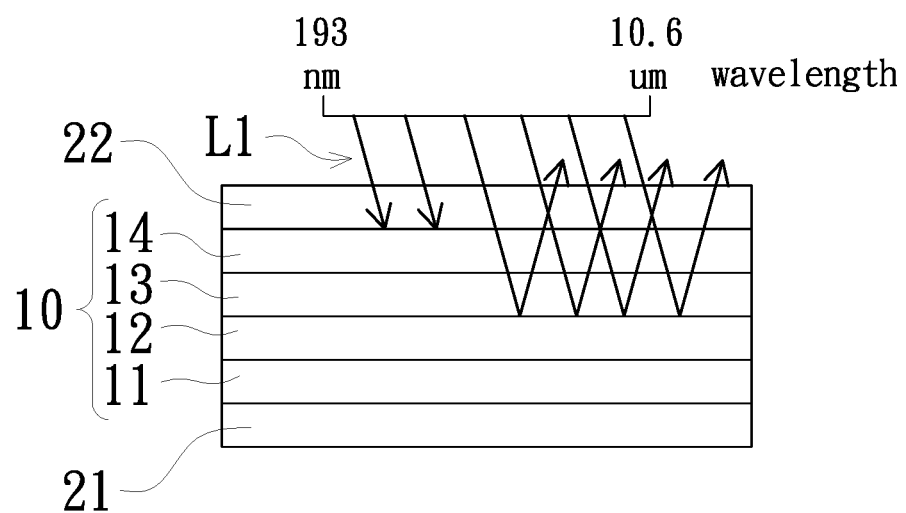
Figure 2C:
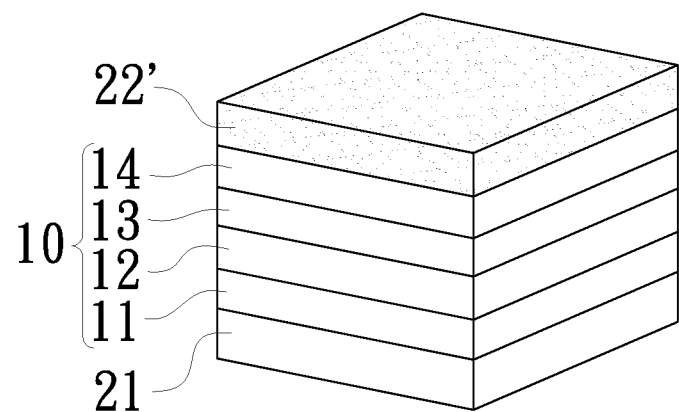

Referring to FIGS. 2a, 2b and 2c. During the formation of the transistor element, an amorphous or nanocrystalline-phase semiconductor layer 22 is first formed on the second dielectric layer 14, wherein the amorphous or nanocrystalline-phase semiconductor layer 22 may be formed using chemical vapor deposition. Thereafter, laser annealing is performed on the amorphous or nanocrystalline-phase semiconductor layer 22 to form the polycrystalline semiconductor layer 22' (refer to FIG. 2c). The polycrystalline semiconductor layer 22' is a polycrystalline structure. The material of the polycrystalline semiconductor layer 22' can be selected from common semiconductor channel materials such as polycrystalline silicon, polycrystalline silicon germanium and polycrystalline germanium. The material of the amorphous or nanocrystalline-phase semiconductor layer 22 can be adjusted according to the polycrystalline semiconductor layer 22' to be formed. The laser annealing involves the following steps. First, at least one laser beam L1 is irradiated to the amorphous or nanocrystalline-phase semiconductor layer 22 to heat the amorphous or nanocrystalline-phase semiconductor layer 22, and then the amorphous or nanocrystalline-phase semiconductor layer 22 is annealed.

The laser beam L1 may be a multi-band laser beam having a wavelength in the range of 193 nm to 10.6 µm, as shown in FIG. 2b. The laser beam L1 may come from at least one of a carbon dioxide laser, an excimer laser annealing (ELA) at 308 nm, a pulse solid-state laser at 355 nm, a continuous-wave laser at 532 nm, an Nd:YAG laser at 532 nm and a diode laser at 1064 nm. In addition, the power of the laser beam L1 may be greater than 75 mJ/cm$^2$, such as 120 or 125 mJ/cm$^2$.

When the laser beam L1 irradiated on the amorphous or nanocrystalline-phase semiconductor layer 22 is a multi-band laser beam, the step of performing laser annealing on the amorphous or nanocrystalline-phase semiconductor layer 22 may be irradiating the multi-band laser beam L1 onto the amorphous or nanocrystalline-phase semiconductor layer 22. In detail, as shown in FIG. 2b, the laser beam L1 may be synthesized by the light beams emitted by a plurality of laser light sources, wherein the wavelengths of the laser light sources may be equal to or different from each other. When the wavelengths of these laser light sources are equal to each other, the wavelength of the laser beam L1 may be 355 nm. When the wavelengths of these laser light sources are different from each other, the wavelength of these laser light sources can range from 193 nm to 10.6 um. For example, at least two laser beams may be irradiated on the amorphous or nanocrystalline-phase semiconductor layer 22 for annealing, wherein the parameters of the laser beams may be different from each other. For example, the two laser beams differ in at least one of wavelength, beam size, power and dwell time. In addition, these laser beams for annealing the amorphous or nanocrystalline-phase semiconductor layer 22 may be irradiated with the amorphous or nanocrystalline-phase semiconductor layer 22 simultaneously or simultaneously.

In the preferred embodiment of the present invention, the multi-band laser beam (i.e., laser beam L1) is formed by the beams emitted by pulsed ultraviolet laser (UV-LSA with a wavelength of 355 nm) and pulsed green laser (GN-LSA with a wavelength of 532 nm), therefore, the present embodiment uses a pulsed ultraviolet laser and a pulsed green laser for laser annealing. The laser annealing is performed at 25° C., the scan pulse width of the laser is 13 nanoseconds, and the scanning speed is 25 cm/s. The beam size of the laser beam L1 is 2.5 mm×65 µm, and the best laser energies of the pulsed ultraviolet laser and pulsed green laser are 125 mJ/cm$^2$ and 120 mJ/cm$^2$. Through the laser beam L1 used in the above embodiment, the average grain size of the polycrystalline semiconductor layer 22' can reach about 800 nm and the S/D impedance can be reduced to 80 Ω/sq at the same time, which is beneficial for the production of transistor elements.

Figure 2D:
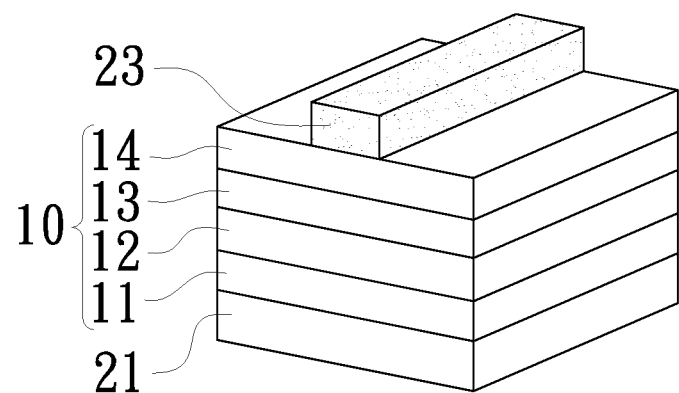
Figure 2E:
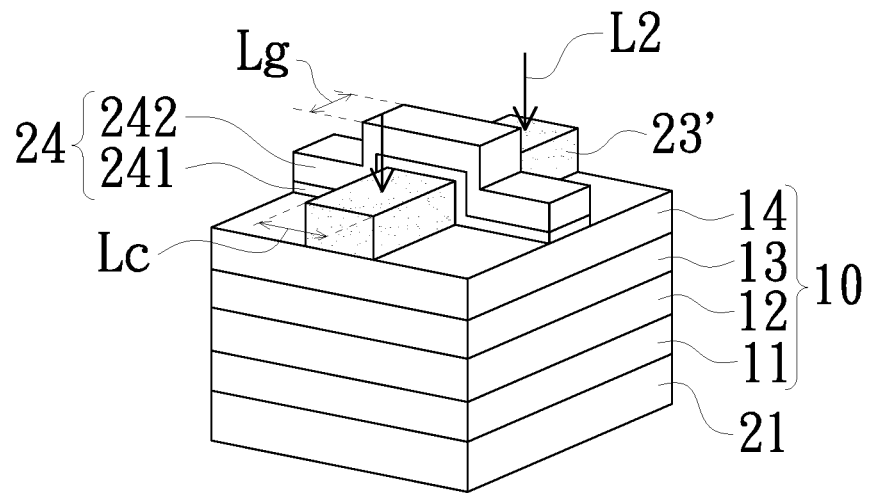

Referring to FIG. 2d, as shown in FIG. 2d, a portion of the polycrystalline semiconductor layer 22' is removed and a portion of the second dielectric layer 14 is exposed to form the channel pattern layer 23. The removing method may be, for example, photolithography or electron beam etching (but not limited here). Referring to FIG. 2e, a gate structure 24 is formed on the channel pattern layer 23 and the second dielectric layer 14. The gate structure 24 includes the gate dielectric layer 241 and the gate layer 242 on the channel pattern layer 23 and the second dielectric layer 14 and the laser beam L2 irradiates a portion of the channel pattern layer 23 not covered by the gate structure 24 for laser activation, so as to form a source/drain structure 23' of polycrystalline structure while the other portion of the channel pattern layers 23 covered by the gate structure 24 become a channel layer connected to the source/drain structure 23'. The wavelength of the laser beam L2 may be different from the wavelength of the laser beam L1, for example, the wavelength of the laser beam L1 may be 355 nm and the wavelength of the laser beam L2 may be 532 nm. Of course, in other embodiments, the wavelength of the laser beam L2 may also be the same as the wavelength of the laser beam L1. In addition, the laser beam L2 may also be a multi-band laser beam. Therefore, the laser activation of the channel pattern layer 23 further includes irradiating a portion of the channel pattern layer 23 with the multi-band laser beam to form the source/drain structure 23'. Therefore, the laser beam L2 may be synthesized by the beams emitted from a plurality of laser light sources, and the wavelengths of these laser light sources may be equal to or different from each other. That is, at least two laser beams may be irradiated on the channel pattern layer 23 for activation, wherein at least one of the parameters of the laser beams, such as wavelength, beam size, power and dwell time, may be different from each other. In addition, these laser beams for laser activation may be irradiated to the channel pattern layer 23 simultaneously or simultaneously.

So far, the transistor element including the gate structure 24 and the source/drain structure 23' has been formed on the second dielectric layer 14. In addition, the material of the gate dielectric layer 241 may be silicon oxide, silicon nitride or the like, or a high dielectric material (such as $Al_2O_3$, $HfO_2$, $ZrO_2$, etc.), and the material of the gate layer 242 may be Al, AlCu, AlSiCu, Mo, TiN, TaN, TiN composite metal materials, TaN composite metal materials.

Figure 2F:
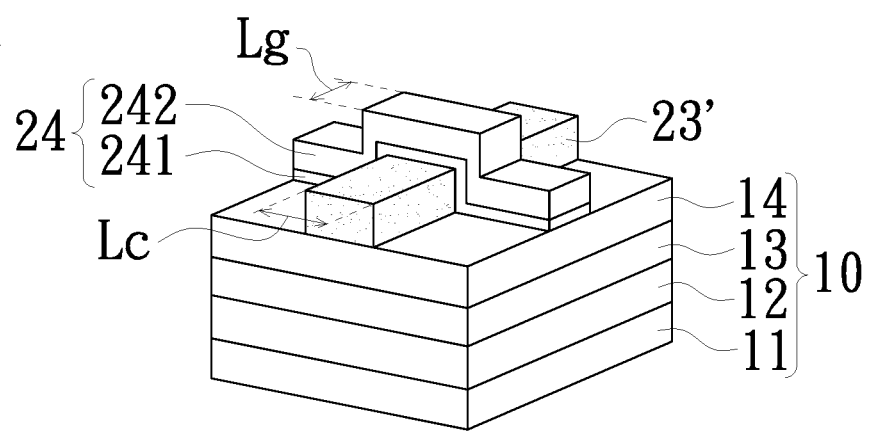

Referring to FIG. 2f, thereafter, the supporting substrate 21 is removed to form the flexible transistor 20 as shown in FIG. 2f, which includes the flexible substrate structure 10 and the transistor element. The flexible transistor 20 shown in FIG. 2f may be a field effect transistor (FET). The gate structure 24 of the flexible transistor 20 is disposed across the source/drain structure 23' and has an extending direction perpendicular to the extending direction of the source/drain structure 23'. However, the flexible transistor 20 is merely for illustrative purpose. The flexible substrate structure provided by the present invention can be applied to other types of transistors, such as complementary metal oxide semiconductor (CMOS), thin film transistor (TFT), etc., and can be also applied to the corresponding existing process methods. Therefore, the description and illustration are omitted herein.

In the prior art, although laser annealing and laser activation have been applied to general non-flexible transistor processes and laser beams having wavelengths greater than 193 nm can be selectively to use for activation or crystallization, the non-flexible transistor cannot be directly applied to the flexible transistor due to the limitations of the existing structure and material properties of the flexible transistor. However, the flexible substrate structure 10 provided in the present invention may be suitable for multi-band laser beams, such as the laser beams of the currently common wavelength range, for laser processing (e.g., laser annealing or laser activation), in which the metal-containing layer 13 can effectively reflect the laser beam energy and can block the high temperature generated by the laser crystallization/activation from being directly transmitted to the underlying flexible substrate 11, so as to prevent the flexible substrate 11 from being damaged.

Furthermore, the first dielectric layer 12 located between the flexible substrate 11 and the metal-containing layer 13 has thermal insulation to prevent the metal-containing layer 13 from damaging the flexible substrate 11 due to the heating of the laser beams L1 and L2. The second dielectric layer 14 is located between the metal-containing layer 13 and the nanocrystalline phase semiconductor layer 22, therefore, in addition to being able to prevent the metal in the metal-containing layer 13 from contaminating the nanocrystalline phase semiconductor layer 22, it can also have the function of heat storage, so that the polycrystalline semiconductor layer 22' formed by crystalline has larger grains size.

According to the actual test of the present inventor using the same short wavelength laser crystallization process, the polycrystalline silicon layer formed on the flexible substrate structure in the present invention has a larger average crystal grain size than the polycrystalline silicon layer formed on the conventional substrate structure. The flexible substrate structure provided in the present invention is also applied to a long wavelength (for example, greater than 193 nm) laser process so that the average grain size can be more than 1 um. Thus, the present invention provides a large grain size that cannot be provided by conventional structures, has the effect of producing large grain sizes at low power, which in turn leads to the unpredictable efficacy of low impedance source/drain effects.

The flexible substrate structure 10 can be used for laser annealing or laser activation with a long wavelength laser beam. Therefore, the present invention can provide the flexible transistor 20 with a smaller element size than the conventional technology, wherein the smallest element size may be down to 400 nm. The description is made of the flexible transistor 20 shown in FIG. 2f, the thickness of the gate dielectric layer 241 is preferably less than 10 nm, and the thickness of the gate layer 242 is preferably less than 100 nm. The thickness of the source/drain structure 23' is preferably greater than 40 nm and less than 150 nm, and is substantially the same as the thicknesses of the polycrystalline semiconductor layer 22' and the channel pattern layer 23.

The transistor element has a gate length Lg and a channel width Lc, wherein the gate length Lg is preferably less than 1 um and the channel width Lc is preferably less than 1 um. In addition, the ratio (Lc/Lg) of the channel width Lc to the gate length Lg may be between 0.5 and 4. The ratio of the channel width Lc to the gate length Lg is proportional to the current between the source/drain structures 23', so the larger the ratio of the channel width Lc to the gate length Lg, the greater the current generated between the source and the drain of the flexible transistor 20. Thus, the flexible transistor 20 facilitates the driving of the deflection of the liquid crystal molecules in the application of the liquid crystal display, thereby enhancing the operation of the liquid crystal display. In addition, according to the different embodiments of the present invention, laser annealing and laser activation can be used singly or separately for single or multi-wavelength laser processing. For example, in an embodiment of the present invention, a laser beam at 355 nm may be used to heat the surface of the channel pattern layer 23' when laser annealing, and then a laser beam at 532 nm may be used for laser activation.

As described above, the prior art utilizes the characteristics of a nanocrystalline phase silicon for absorbing a laser beam with a short wavelength (308 nm or less) to select a short wavelength that can be absorbed by the nanocrystalline phase silicon (up to 308 nm, the largest wavelength that can be absorbed by the currently used organic materials and applied to process lines). And because the light energy in the absorption process is converted into thermal energy, it is necessary to have a dielectric layer with a thickness of at least 2 um or more between the nanocrystalline phase silicon and organic materials for thermal insulation, wherein the thicker the dielectric layer, the larger the resulting grain size, and the more conducive to enhancing the performance of the transistor element. In the present invention, the crystallization is performed by utilizing the characteristic of nanocrystalline phase semiconductor layer absorbing short wavelength. By changing the flexible substrate structure, the laser annealing crystallization can be performed by using the heat storage characteristics of the metal layer/dielectric layer under the premise of preventing the light beam from penetrating and damaging the flexible substrate, and laser activation can also be performed by using the same structure.

Although related ideas have been proposed for multi-wavelength laser processes to improve product performance, the theory cannot be effectively applied to production lines because of the existing structural and material characteristics. However, the flexible substrate structure provided by the present invention can solve the above problems and perform crystallization and activation in a flexible transistor process under the premise of being able to apply the existing materials and the laser technology on existing production lines to manufacture a small-sized flexible transistor element that cannot be manufactured by a thermal annealing process. In addition, as the present invention uses the metal layer/dielectric layer to store heat for the crystallization process of the flexible transistor, a larger average grain size can also be produced using the same laser power as in the prior art, and it is more possible to produce a larger grain size that the conventional flexible transistor cannot achieve in the embodiments using the long-wavelength laser. Therefore, the structure and the method provided by the present invention have the effect of generating large grain size at low power, thereby achieving an unexpected effect of a low impedance source/drain effect.

In summary, the present invention provides a flexible substrate structure, a flexible transistor including the above-mentioned flexible substrate structure and a method for fabricating the same. The flexible substrate structure can be applied to a long wavelength (for example, a wavelength longer than 193 nm) laser processing, such as laser annealing or laser activation. Crystallization (e.g., laser crystallization) and activation (e.g., laser activation) in a flexible transistor process can be performed based on the existing materials and laser technology conventionally used on the production line, so that a small-sized flexible transistor element that cannot be achieved by the thermal annealing process can be fabricated, the size of the flexible transistor element makes can be further reduced to less than 1 un and even to 400 nm or less.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A flexible transistor, comprising:
   a flexible substrate structure, comprising:
   a flexible substrate;
   a first dielectric layer, located on the flexible substrate;
   a metal-containing layer, having a reflectivity greater than 15% and a heat transfer coefficient greater than 2 W/m-K; and
   a second dielectric layer, wherein the metal-containing layer is disposed between the first dielectric layer and the second dielectric layer, and the second dielectric layer is an inorganic material layer; and
   a transistor element, formed on the second dielectric layer.

2. The flexible transistor according to claim 1, wherein the first dielectric layer is an inorganic material layer.

3. The flexible transistor according to claim 1, wherein the transistor element has a channel width and a gate length,
   wherein the channel width is less than 1 um, whereas the gate length is less than 1 um,
   wherein the transistor element comprises:
   a source/drain structure, formed on the second dielectric layer and having a polycrystalline structure; and
   a gate structure, disposed on the source/drain structure.

4. The flexible transistor according to claim 1, wherein the metal-containing layer contacts and is disposed on the first dielectric layer, and the second dielectric layer contacts and is disposed on the metal-containing layer.

5. The flexible transistor according to claim 1, wherein a glass transition temperature of the flexible substrate is lower than 450° C.

6. The flexible transistor according to claim 1, wherein the metal-containing layer completely covers the first dielectric layer.

7. The flexible transistor according to claim 1, wherein the metal-containing layer completely covers the flexible substrate.

* * * * *